United States Patent [19]

Durand et al.

[11] Patent Number: 4,765,863
[45] Date of Patent: Aug. 23, 1988

[54] METHOD OF PREPARING A CRYSTALLINE INGOT OF $Hg_{1-x_0}Cd_{x_0}Te$

[75] Inventors: Alain R. L. Durand; Jean-Luc Dessus, both of Poitiers; Michel Royer, Paris, all of France

[73] Assignee: S.A.T. (Societe Anonyme de Telecommunications), Paris, France

[21] Appl. No.: 4,571

[22] Filed: Jan. 20, 1987

[30] Foreign Application Priority Data

Jan. 21, 1986 [FR] France ............................... 86 00769

[51] Int. Cl.$^4$ .......................... C30B 9/06; C30B 11/04
[52] U.S. Cl. .................................. 156/604; 156/616.1;
156/616.3; 156/616.41; 156/624; 156/DIG. 10;
156/DIG. 72; 156/DIG. 82; 156/DIG. 92
[58] Field of Search ............... 156/604, 616 R, 616 A, 156/620, 624, DIG. 70, DIG. 72, DIG. 82, DIG. 92

[56] References Cited

U.S. PATENT DOCUMENTS

| 3,849,205 | 11/1974 | Brau et al. ........................... 423/508 |
| 4,435,224 | 3/1984 | Durand ....................... 156/DIG. 72 |
| 4,474,640 | 10/1984 | Wan ............................. 156/DIG. 72 |
| 4,551,196 | 11/1985 | Capper et al. .................. 156/616 R |
| 4,564,415 | 1/1986 | Fillot et al. ................. 156/DIG. 72 |
| 4,591,410 | 5/1986 | Ziegler ......................... 156/DIG. 72 |
| 4,662,980 | 5/1987 | Triboulet et al. .......... 156/DIG. 72 |

FOREIGN PATENT DOCUMENTS

| 60744 | 9/1982 | European Pat. Off. ........ 156/616 R |
| 2536767 | 6/1984 | European Pat. Off. ........ 156/616 R |
| 115715 | 8/1984 | European Pat. Off. ........ 156/616 R |
| 59-169995 | 9/1984 | Japan ............................. 156/616 R |
| 1434437 | 5/1976 | United Kingdom ....... 156/DIG. 72 |

Primary Examiner—John Doll
Assistant Examiner—Robert M. Kunemund
Attorney, Agent, or Firm—Stevens, Davis, Miller & Mosher

[57] ABSTRACT

A method is disclosed for preparing a crystalline ingot of $Hg_{1-x_0}Cd_{x_0}Te$. Before moving a heated solvent zone for progressively dissolving ingot sources and giving rise to a single ingot, an adaptation zone is created from a monocrystalline germ by heating and cooling the solvent in contact with the germ, the ingot obtained is monocrystalline. The method of the invention in particular reduces the manufacturing costs of components such as infrared detectors and avalanche diodes.

8 Claims, 2 Drawing Sheets

METHOD OF PREPARING A CRYSTALLINE INGOT OF $Hg_{1-x_0}Cd_{x_0}Te$

BACKGROUND OF THE INVENTION

1. Field of the Invention

The present invention relates to a method of preparing a crystalline ingot of $Hg_{1-x_0}Cd_{x_0}Te$ of a substantially uniform composition by the THM method (Traveling Heater Method) in which:

at the bottom of a substantially cylindrical vertical enclosure is disposed a solidified mixture of Te, Hg Te and Cd Te in proportions corresponding to those of the liquid phase, at said predetermined temperature (T) of said ingot to be prepared, a cylindrical source ingot of Hg Te and a cylindrical source ingot of Cd Te are disposed in contact with said solidified mixture, the ratio of their respective sections being equal to the desired Hg/Cd ratio of said prepared ingot, said enclosure is closed, under a vacuum, the zone of the enclosure corresponding to said solidified mixture is heated so as to melt this latter and to bring it to said predetermined temperature (T), thus obtaining a solvent zone for dissolving the parts of said source ingots in contact with the solvent zone, and said heated zone is moved along said enclosure so as to move said solvent zone and to progressively dissolve said source ingots at one of the ends thereof and so as to obtain, at its other end, the crystallization of said $Hg_{1-x_0}Cd_{x_0}Te$ ingot to be prepared.

The crystalline ingots thus prepared are used for manufacturing infrared radiation detectors or else avalanche diodes. Such devices are obtained by known processes of doping a substrate cut from such an ingot.

2. Description of the Prior Art

A method of the above defined type is already known, described in French Pat. No. 81 05387 in the name of the applicant. This method allows crystalline ingots to be prepared having the shape of a circular cylinder of a diameter of the order of 20 mm. By cutting such a cylinder into slices of appropriate thickness, a large number of disks is obtained. Each of these disks forms a flat wafer from which, considering its relatively large area, a large number of electronic components of the above type may be obtained, whose area is relatively small. The disk is then cut up so that each component is available individually. However, a relatively large amount of these components, having characteristics out of tolerance, must be rejected. This is due to the fact that these components, in order to operate satisfactorily, must be formed on a monocrystalline substrate, that is to say formed of a crystal having, on the macroscopic scale, an orientation and only one, and only having defects if there are any, on the atomic scale. Now, the $Hg_{1-x_0}Cd_{x_0}Te$ ingot obtained by the above mentioned method is of a polycrystalline structure, that is to say formed, on the macroscopic scale, of a plurality of monocrystals of different orientations, of maximum dimensions of the order of 10 mm, separated by grain joints and having crystalline defects. The electronic components to be rejected are those which are formed on the parts of the disk comprising the joints and the defects. To avoid such rejects, the consequence of which is harmful in so far as the manufacturing costs are concerned, it would then be necessary to use monocrystalline disks of defined orientation.

A method of manufacturing such a monocrystalline layer of $Hg_{1-x_0}Cd_{x_0}Te$ is known by epitaxy in the liquid phase from a monocrystalline substrate of Cd Te, for example. However, the thickness of such a layer is limited to 10 microns or so, and the method, which only allows one layer to be manufactured at a time and requires a new germ each time, is costly.

In order to obtain using the THM method a monocrystalline ingot of appreciable volume, attempts have already been made to use a monocrystalline germ of Cd Te, for example, previously disposed at the bottom of the preparation enclosure. However, it has been discovered in this case that, at the beginning of the process for drawing the ingot, a beginning of the dissolution of the germ by the solvent occurs which disturbs the appearance of the composition balance which normally takes place within the solvent zone. This uncontrolled phenomenon introduces longitudinal variations of the composition of the ingot obtained, in which there still exists a considerable density of crystalline defects, and sometimes grain joints. A zinc or selenium doping reduces this crystalline defect density, but the grain joints still exist.

SUMMARY OF THE INVENTION

The present invention aims at overcoming the above drawbacks by providing a method for preparing monocrystalline $Hg_{1-x_0}Cd_{x_0}Te$ ingots in which the crystalline defect density is further reduced with respect to the preceding method, the diameter and the volume of the prepared ingots being relatively large, so as to obtain wafers of a large area on which a large number of multielement patterns may be etched which are met with more and more often in present applications. For this, it provides a method of the above defined type wherein before disposing said solidified mixture at the bottom of said enclosure, a monocrystalline germ of $Hg_{1-x_1}Cd_{x_1}Te$ is disposed at the bottom of said enclosure such that:

$$x_o < x_1 \leq 1$$

said germ being provided with a flat and polished face.

and after disposing said solidified mixture in the bottom of said enclosure, in contact with said solidified mixture is disposed a piston of a density less than that of the solvent having a flat base, said enclosure is closed, under a vacuum, without disposing said source ingots inside, the zone of the enclosure is heated corresponding to said solidified mixture so as to bring the solvent obtained to said predetermined temperature, for the time necessary for dissolving the part of said germ which has been work hardened by polishing, then the mixture is cooled at a given rate so as to obtain the crystallization of an adaptation zone, said enclosure is opened and said piston is withdrawn so as to dispose said source ingots in contact with said solidified mixture.

In the method of the invention, the ingot obtained is monocrystalline. This result is obtained for, during a step prior to the step for drawing the ingot, and separate therefrom, a perfect balance of the composition is obtained by heating, without movement of the heated zone, in the solvent zone in the presence of the germ, then by cooling crystallization is obtained of an adaptation zone in which the variation of the parameters of the crystal is continuous. When this step is finished, drawing out is proceded with, during which and in a way known per se the balance is obtained, at the predetermined temperature, of the composition of the solvent zone with the ingot sources, which are dissolved in constant proportions. The $Hg_{1-x_o} Cd_{x_o} Te$ ingot which is crystallized at the rear of the solvent zone has a monocrystalline structure initiated by the germ, via the adapatation zone. Furthermore, the adjustment provided by this latter confers on the ingot obtained a longitudinal profile of a composition whose variations are smaller than in the known method.

Advantageously, since said solidified mixture has a flat face, when it is disposed at the bottom of said enclosure, its flat face is disposed against said flat and polished face of said germ.

Again advantageously, and as in the THM method described in the cited patent, said solidified mixture with a flat face is prepared by heating, in said closed enclosure, the solid constituents of said mixture, disposed under said piston, until they are molten, said mixture being removed from said enclosure after solidification.

It is possible to put the method of the invention into practice using a solid germ or a germ obtained by epitaxy on a substrate of a different kind.

In order to obtain several ingots having strictly the same composition, the same germ can be used for preparing these ingots.

BRIEF DESCRIPTION OF THE DRAWINGS

The invention will be better understood from reading the following description of the preferred embodiment of the method of the invention, with reference to the accompanying drawings in which.

DESCRIPTION OF THE PREFERRED EMBODIMENT

The method of the invention for preparing a monocrystalline ingot of $Hg_{1-x_o} Cd_{x_o} Te$ uses in particular the known so called THM method (Traveling Heater Method) described in the French Pat. No. 81 05387 in the name of the applicant in connection with the preparation of a polycrystalline ingot of $Hg_{1-x_o} Cd_{x_o} Te$, which method will now be briefly recalled.

Figure 1:
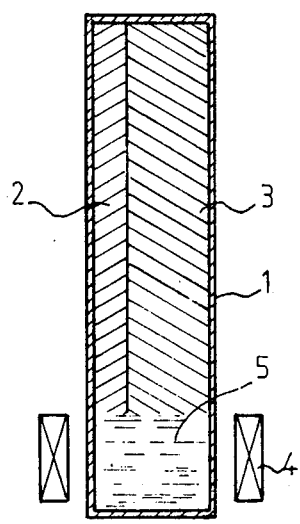
FIG. 1 illustrates schematically a first phase in the preparation of an ingot using the known THM method.

In the known method, and as shown in FIG. 1, an annular heating device 4, including a conducting winding, locally surrounds a substantially cylindrical enclosure 1. Enclosure 1, made from a refractory material and hermetically closed, has a vertical axis and contains, in its upper part, a source ingot 2 of Hg Te and a source ingot 3 of Cd Te, these two ingots being cylindrical, having any, but constant, sections $S_2$ and $S_3$ and with a vertical axis. Sections $S_2$ and $S_3$ are such that:

$$x_o = S_3/(S_2+S_3) \quad (1)$$

that is to say:

$$S_2/S_3 = (1-x_o)/x_o \quad (2)$$

Figure 2:
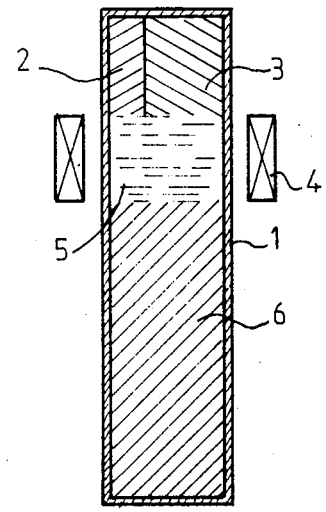
FIG. 2 illustrates schematically a second phase of the method of FIG. 1.

The lower parts of the source ingots 2 and 3 are dissolved in a solvent zone 5 brought to a temperature T by the annular heating device 4. The enclosure 1 is then caused to move vertically downwards, at a very slow speed, of the order of a few millimeters per day, and for example of 100 microns per hour. As shown in FIG. 2, in the lower part of zone 5 which is cooled after passing through the annular device 4, there occurs a recrystallization which gives rise to a single polycrystalline ingot 6 of $Hg_{1-x_o} Cd_{x_o} Te$. This step is called the ingot drawing step.

In this known method, the temperature T for heating the solvent is between 600° and 700° C. When $x_o$ is less than 0.5, a temperature T is preferably chosen close to 650° C. and when it is greater than 0.5, a temperature T is preferably chosen close to 700° C.

In order to obtain a polycrystalline ingot of $Hg_{1-x_o} Cd_{x_o} Te$ in which $x_o$ is constant over the whole of its length, the above patent provides for the use of a tellurium rich solvent containing Hg Te, Cd Te and Te in proportions determined for example empirically in the following way.

After choosing the temperature T for heating the solvent, a polycrystalline ingot is prepared using pure tellurium as starting solvent for two source ingots of Hg Te and Cd Te, having sections in a ratio corresponding to $x_o$ in accordance with the equations (1) and (2). Since pure tellurium is used as starting solvent, the composition of the $Hg_{1-x}Cd_x Te$ ingot is not constant over the whole of its length, the head of the ingot, that is to say the part which was crystallized first after passing through the solvent zone being too rich in cadmium, that is to say that:

$$x > x_o \quad (3)$$

However, as the enclosure descends with respect to the fixed heating device, the solvent zone, corresponding at the outset to pure tellurium, then enriched with Cd Te and Hg Te in a ratio equal to that of the sections of the source ingots, will be progressively impoverished in cadmium and enriched in mercury so as to finally arrive at a balance composition, such that the solvent zone, brought to temperature T and fed with Hg Te and Cd Te in a ratio of the sections of the source ingots, related to $x_o$, gives rise to an ingot whose x composition is equal to $x_o$. This composition corresponds to that of the liquid phase, at temperature T, of the ingot of composition $x_o$.

This composition could be determined theoretically taking into account the temperature T and the desired ratio $x_o$, but it is possible to determine it empirically by suddenly cooling the solvent zone after a sufficient drawing time for an ingot zone to be reached where x is equal to $x_o$. Then the solvent zone is subjected to an analysis.

By way of example, for T=700° C. and $x_o=0.7$ we find:
Te=68 molar %
CdTe=2 molar %
HgTe=30 molar %
For T=650° C. and $x_o=0.2$, we find:
Te=32.5 molar %

CdTe=4 molar %
HgTe=63.5 molar %

Figure 3:
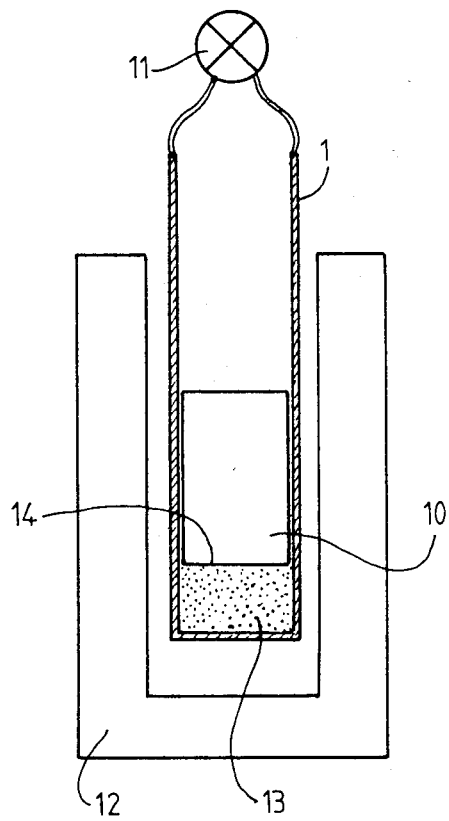
FIG. 3 illustrates the preparation of the solvent zone required in the method of FIG. 1.

After this preliminary step for determining the composition of the solvent, this latter is prepared as described in the above mentioned patent, that is to say by placing in the enclosure 1, here with a flat bottom, tellurium Te, mercury telluride Hg Te and cadmium telluride Cd Te, in the form of solid pieces. As shown in FIG. 3, a quartz piston 10 with a flat base is disposed on these products, a vacuum is formed by means of the valve 11, a neutral gas is introduced, under a pressure of 2 to 3 atmospheres, and the products are heated in an oven 12, to a sufficient temperature to cause them to melt.

The piston 10 floats on this molten mixture for its density is less than that of this latter. After 2 to 3 hours, the heating is stopped and the mixture 13 solidifies with a very flat upper face 14 because of the flat base of piston 10.

In the method of preparing polycrystalline ingots described in the above mentioned patent, the enclosure 1 which has served for preparing the solidified mixture 13 is opened, the piston 10 is withdrawn, source ingots are introduced and, after heating of the solidified mixture 13 so as to obtain the solvent 5, an operation is proceeded with for drawing out a polycrystalline ingot of homogeneous composition over the whole of its length, with $x=x_o$.

In the preparation method which will now be described, for preparing a monocrystalline ingot of $Hg_{1-x_o} Cd_{x_o} Te$, where $x_o$ is between o and 1, the step for drawing out the ingot is identical to that which has just been described. It is preceded by a preliminary step which will now be described.

This step includes first of all the preparation of a solid monocrystalline germ of $Hg_{1-x_1} Cd_{x_1} Te$ where $x_1$ is such that $$x_o < x_1 \leq 1$$

By way of example, for $x_o=0.2$, $x_1=0.22$ can be chosen.

Figure 4:
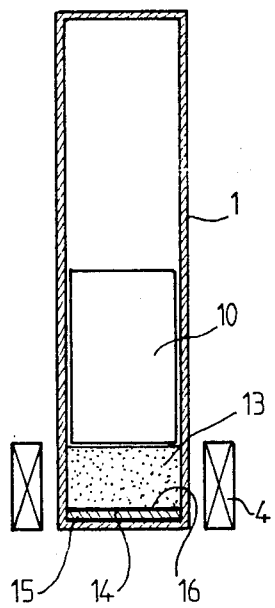
FIG. 4 illustrates schematically a first phase of the method of the invention.

This germ is obtained either from a monocrystalline block available in a polycrystal or else using the method of the invention, as will be seen further on. As shown in FIG. 4, this germ is machined so as to have the shape of a disk 15, one face 16 of which is polished and oriented with respect to the orientation of the crystal (100 or 111). It is disposed at the bottom of the enclosusre 1 of which it has substantially the shape, and the polished face 16 is directed upwards. Above is disposed a block of solvent 13, prepared as in the known method, so that the flat face 14 of the block is in contact with the flat and polished face 16 of the germ 15. The quartz piston 10 is placed on top and the enclosure 1 is closed under a vacuum. With the enclosure 1 held immobile, the solvent block is heated to the temperature T by means of the heating device 4 for a sufficient time for dissolving the germ over a thickness of a few tens of microns. By way of indication, this time is of the order of an hour for a temperature T of 650°, a cadmium tellurium germ Cd Te and the solvent whose composition was stated above.

The purpose of this operation is to dissolve the zone which was work hardened by polishing the face 16 of germ 15, which presents dislocations and impurities due to the mechanical treatment. After this heating, the first undissolved layer of the monocrystalline germ 15 is a layer having no defect and perfectly clean.

After the preceding heating operation, the heated zone is cooled at a given rate, less than the cooling rate which is that of the solvent zone 5 during the drawing out operation already desribed. There is then crystallization of an adaptation zone, or crystallization interface, in the neighborhood of germ 15. Inside this monocrystalline adaptation zone, there is a continuous variation of the interatom distance that is to say of the mesh parameter, as well as of other parameters of the crystal, such as the temperature, expansion and conduction coefficients for example.

The cooling rate, determined experimentally, influences the formation of this adaptation zone. If it is too fast, crystalline defects appear in the solidified zone, if it is too slow the segregation continues and the adaptation zone disappears to the benefit of an inhomogeneity of the crystal.

After complete cooling of the contents of enclosure 1, the preliminary step is finished and, after opening enclosure 1, piston 10 is withdrawn and source ingots 2 and 3 of Hg Te and Cd Te are disposed as in the known method.

Figure 5:
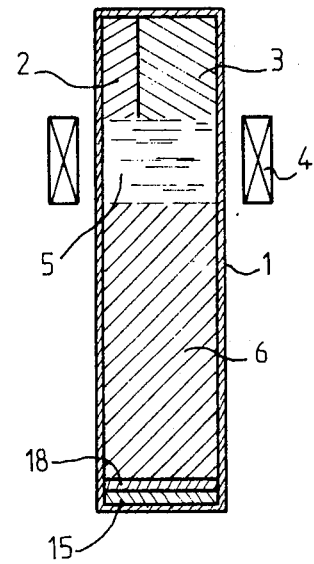
FIG. 5 illustrates schematically a second phase of the method of FIG. 4.

After reclosing the enclosure 1 under a vacuum, the solidified mixture 13 is heated until balance is reached at temperature T of solvent 5 with the source ingots and then the enclosure is moved, as shown in FIG. 5, so as to go ahead with drawing out the ingot 6 as in the known method. Because of the adaptation zone 18, ingot 6 is on the one hand monocrystalline and on the other has a very good radial and longitudinal homogeneity of composition.

It is possible to provide an enclosure of a diameter slightly greater than the diameter of the germ, the connection being provided by a truncated cone shaped part.

Thus a monocrystalline ingot may be obtained of a diameter slightly greater than that of the germ, from which a new germ of a larger diameter may be cut. Thus, proceeding gradually and from a first germ available in the natural state in a polycrystalline ingot, germs and ingots are obtained of a larger and larger diameter. The length of the ingot is only limited by the possibilities of the installation.

By way of example for $x_o=0.2$, the applicant has obtained ingots of 20, 30 and 40 mm in diameter and 60 mm in length, with a dispersion with respect to the value of $x_o$ such that $x_o=0.200 \mp 0.007$ on the length and $x_o=0.2000 \mp 0.0015$ on the diameter.

In the preceding description, a solid monocrystalline germ was used. This is not obligatory and a monocrystalline germ may also be used obtained by epitaxy on a substrate of a different nature, such as for example gallium arsenide or sapphire.

If so desired, and in order to obtain a set of ingots of strictly uniform composition, a first ingot may be formed from a certain germ, the base of the first ingot may be cut so as to recover the germ and so on, so as to obtain several ingots prepared from the same germ.

What is claimed is:
1. In a method of preparing a crystalline ingot of $Ho_{1-x_o} C_{x_o} Te$ of a substantially uniform composition using the THM method (Traveling Heater Method) comprising:
   (a) disposing at the bottom of a substantially cylindrical and vertical enclosure a solidified mixture of Te, Hg Te and Cd Te in proportions corresponding to those of the liquid phase, at a temperature at which said ingot is to be prepared;

(b) disposing in contact with said solidified mixture a cylindrical source ingot of Hg Te and a cylindrical source ingot of Cd Te, the ratio of the source ingots respective sections being equal to the desired HgCd ratio $((1-x_o)/x_o)$ of said crystalline ingot to be prepared, wherein $0<x_o<1$;

(c) subjecting the enclosure to a vacuum;

(d) heating a zone of the enclosure, corresponding to said solidified mixture, to melt the solidified mixture and bring it to said temperature, thus obtaining a solvent zone for dissolving the parts of said source ingots in contact with the solvent zone; and (e) moving said heated zone along said enclosure so as to move said solvent zone and to progressively dissolve, at one of the ends thereof, said source ingots and to obtain, at its other end, the crystallization of said $Hg_{1x1}Cd_{xo}$ Te ingot to be prepared, wherein the improvement comprises (f) providing, before disposing the solidified mixture of step (a), a monocrystalline germ of $Hg_{1-x1} Cd_{x1}$ Te, wherein $x_o < x_1, \leq 1$, said germ having a flat and polished face, in the bottom of said enclosure;

(g) disposing a block of a solid solvent mixture in contact with said polished face, said solvent mixture, in its liquid state, capable of dissolving said monocrystalline germ;

(h) placing a piston having a flat base and a density less than that of the solvent in contact with said solidified solvent;

(i) closing the enclosure and subjecting it to a vacuum;

(j) heating the enclosure to at least partially melt the block of solvent mixture in contact with said polished face so as to dissolve the part of said germ which has been work hardened by polishing;

(k) cooling the enclosure at a given rate so as to crystallize said melt of step (j), the solidified melt forming an adaption zone between said germ and said solid solvent mixture;

(l) opening said enclosure and withdrawing the piston; and, (m) disposing said source ingots in contact with said solid solvent mixture.

2. The method of claim 1, wherein said block of solid solvent mixture has at least one flat face, including the step of disposing said flat face in contact with said flat and polished face of said germ.

3. The method as claimed in claim 2, wherein said block of solid solvent mixture having a flat face is prepared by heating, prior to step (g), in said closed enclosure, the solid constituents of said mixture disposed under said piston until they are melted, said mixture being removed from said enclosure after solidification.

4. The method as claimed in one of claims 1, 2 or 3, wherein said germ is obtained by epitaxy on a substrate of a different nature.

5. The method as claimed in one of claims 1, 2 or 3, wherein the same germ is used for preparing several ingots.

6. The method as claimed in claim 1, 2 or 3, wherein melting of the constituents of said block of solid solution mixture takes place in a neutral gas atmosphere.

7. The method as claimed in one of claims 1, 2 or 3, wherein said temperature is substantially between 600° C. and substantially 700° C.

8. Method according to one of claims 1, 2 or 3, wherein $x_o=0.2$ and $x_1=0.22$, said temperature is 650° C. and the composition of said block of solid solution mixture is substantially:

Te=32.5 molar %
CdTe=4 molar %
HgTe=63.5 molar %.

* * * * *